(12) United States Patent
Koo (10) Patent No.: US 10,302,701 B2
(45) Date of Patent: May 28, 2019

(54) MEMORY APPARATUS RELATING TO DETERMINATION OF A FAILED REGION AND TEST METHOD THEREOF, MEMORY MODULE AND SYSTEM USING THE SAME

(71) Applicant: SK hynix Inc., Icheon-si, Gyeonggi-do (KR)

(72) Inventor: Ja Beom Koo, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/674,903

(22) Filed: Aug. 11, 2017

(65) Prior Publication Data

US 2018/0218777 A1 Aug. 2, 2018

(30) Foreign Application Priority Data

Jan. 31, 2017 (KR) .......................... 10-2017-0013627

(51) Int. Cl.
*G01R 31/3193* (2006.01)
*G11C 29/02* (2006.01)
*G11C 5/04* (2006.01)
*G11C 29/38* (2006.01)

(52) U.S. Cl.
CPC ... *G01R 31/3193* (2013.01); *G01R 31/31935* (2013.01); *G11C 5/04* (2013.01); *G11C 29/025* (2013.01); *G11C 29/38* (2013.01)

(58) Field of Classification Search
CPC .................................................. G01R 31/3193
See application file for complete search history.

(56) References Cited

U.S. PATENT DOCUMENTS

| 2002/0073367 | A1 | 6/2002 | Hartmann |  |
|---|---|---|---|---|
| 2005/0057995 | A1* | 3/2005 | Mitani | G11C 8/10 365/222 |
| 2008/0239812 | A1* | 10/2008 | Abiko | G11C 11/5628 365/185.12 |
| 2014/0254264 | A1* | 9/2014 | Dutta | G11C 16/3459 365/185.03 |

FOREIGN PATENT DOCUMENTS

KR 1020130102398 A 9/2013

* cited by examiner

*Primary Examiner* — Joseph D Torres
(74) *Attorney, Agent, or Firm* — William Park & Associates Ltd.

(57) ABSTRACT

A memory device may be provided. The memory device may include a test data output circuit configured to compare lower data output from a lower data storage region with upper data output from an upper data storage region and make a decision. The memory device may include a data transmitter configured to output the lower data by inverting or noninverting the lower data according to the decision. The memory device may include a test control circuit generates a test control signal according to a test read signal and an address signal.

19 Claims, 6 Drawing Sheets

MEMORY APPARATUS RELATING TO DETERMINATION OF A FAILED REGION AND TEST METHOD THEREOF, MEMORY MODULE AND SYSTEM USING THE SAME

CROSS-REFERENCES TO RELATED APPLICATION

The present application claims priority under 35 U.S.C. § 119(a) to Korean application number 10-2017-0013627, filed on Jan. 31, 2017 in the Korean Intellectual Property Office, which is incorporated herein by reference in its entirety as set forth in full.

BACKGROUND

1. Technical Field

Various embodiments may generally relate to a semiconductor technology, and more particularly, to a memory is apparatus, a memory module and a system using the same.

2. Related Art

An electronic device includes a lot of electronic elements. A computer system includes lots of electronic elements including semiconductor apparatuses. The computer system as a representative electronic device includes a processor serving as a host and a memory serving as a data storage device. Particularly, a plurality of memories may be formed in a module, may be mounted in the memory system, and may serve as a temporary storage device. A representative module is a dual in-line memory module (DIMM). In general, a DIMM includes a plurality of DRAMs and performs data communication with the processor through the plurality of DRAMs. Since the DIMM includes a plurality of memory devices, it may take a lot of time to test the DIMM.

SUMMARY

In an embodiment, a memory device may be provided. The memory device may include a test data output circuit configured to generate a decision signal by comparing lower data output from a lower data storage region with upper data output from an upper data storage region, and may output the lower data and the decision signal based on a test control signal. The memory device may include a data transmitter configured to output the lower data by inverting or noninverting the lower data according to the decision signal. The memory device may include a test control circuit configured to generate the test control signal according to a test read signal and an address signal.

In an embodiment, a system may be provided. The system may include a memory module including a plurality of memory devices. The system may include a host configured to control the memory module by communicating with the memory module. Each of the plurality of memory devices may include a test data output circuit configured to generate a decision signal by comparing lower data output from a lower data storage region with upper data output from an upper data storage region, and output the lower data and the decision signal based on a test control signal. Each of the plurality of memory devices may include a data transmitter configured to output the lower data by inverting or noninverting the lower data according to the decision signal. Each of the plurality of memory devices may include a test control circuit configured to generate the test control signal according to a test read signal and an address signal.

In an embodiment, a method of testing a memory device may be provided. The method may include generating a decision signal by comparing lower data output from a lower data storage region with upper data output from an upper data storage region by providing a test address, and storing the lower data. The method may include inverting the lower data when the lower data is different from the upper data; providing the test address again, and outputting the stored lower data. The method may include determining whether or not a fail occurs in the lower data storage region or the upper data storage region based on whether or not the lower data is a failed data.

DETAILED DESCRIPTION

Hereinafter, a semiconductor apparatus according to various embodiments will be described below with reference to the accompanying drawings through examples of embodiments.

Figure 1:
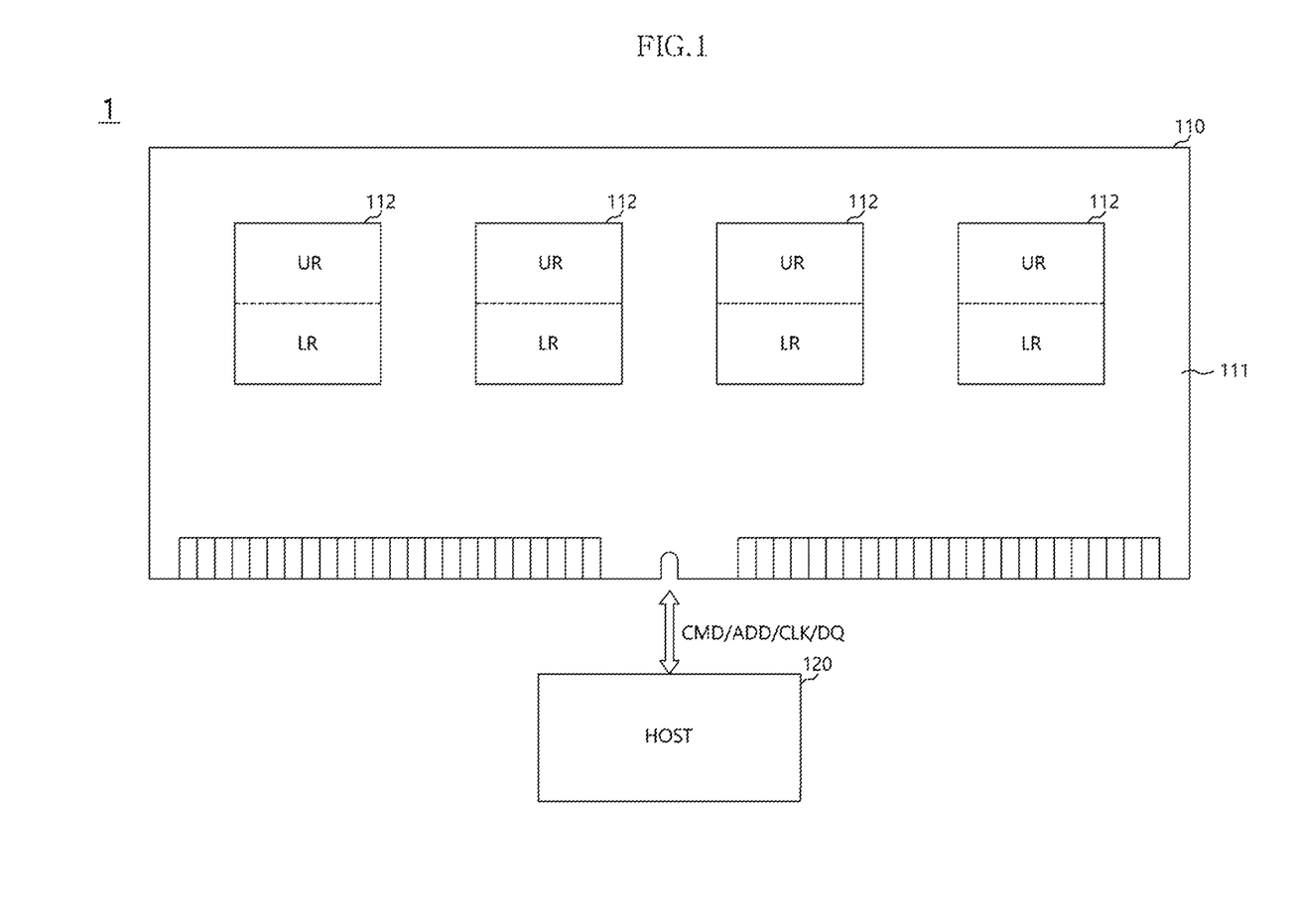
FIG. 1 is a diagram illustrating a representation of an example of a system in accordance with an embodiment.

FIG. 1 is a diagram illustrating a representation of an example of a system 1 in accordance with an embodiment. Referring to FIG. 1, the system 1 may include a memory module 110 and a host 120. The host 120 and the memory module 110 may perform data communication with each other. The host 120 may control the memory module 110 to perform data input and output (input/output) operations. The host 120 may be a master device for controlling the memory module 110, and may include one or more among the central processing unit (CPU), the graphic processing unit (GPU), the multi-media processor (MMP) and the digital signal processor. The host 120 may be implemented in a form of the system on chip (SoC) by combining processor chips having various functions such as the application processor (AP). The host 120 may be a test device for testing the memory module 110. The host 120 may control the memory module 110 by providing various control signals to the memory module 110. For example, the host 120 may provide the memory module 110 with a command signal CMD, an address signal ADD, a clock signal CLK and data DQ. An operation of transmitting data DQ from the host 120 to the memory module 110 may be defined as a write operation, and an operation of transmitting data DQ from the memory module 110 to the host 120 may be defined as a read operation. During the write operation, the host 120 may provide the memory module 110 with the command signal CMD, the address signal ADD, and the data DQ. During the read operation, the host 120 may provide the memory module 110 the command signal CMD and the address signal ADD and may receive the data DQ provided from the memory module 110.

The memory module 110 may include a module substrate 111 and a plurality of memory devices 112. The plurality of memory devices 112 may be mounted on the module substrate 111. The plurality of memory devices 112 may include one or more of volatile memories and nonvolatile memories. The volatile memories may include the Static RAM (SRAM), the Dynamic RAM (DRAM) and the Synchronous DRAM (SDRAM). The nonvolatile memories may include the Read Only Memory (ROM), the Programmable ROM (PROM), the Electrically Erase and Programmable ROM (EEPROM), the Electrically Programmable ROM (EPROM), the flash memory, the Phase change RAM (PRAM), the Magnetic RAM (MRAM), the Resistive RAM (RRAM), the Ferroelectric RAM (FRAM) and so forth. The memory module 110 may receive the command signal CMD and the address signal ADD provided from the host 120, may store the data DQ provided from the host 120 during the write operation, and may provide stored data DQ to the host 120 during the read operation. For example, the memory module 110 may be implemented in one of modules including Unbuffered Dual In-line Memory Module (UDIMM), Dual Inline Memory Module (DIMM), Registered Dual In-line Memory Module (RDIMM), Load Reduced Dual In-line Memory Module (LRDIMM), Small Outline Dual In-line Memory Module (SODIMM) and Non-Volatile Dual In-line Memory Module (NVDIMM). The memory module 110 may be one including the advanced memory buffer capable of performing substantially similar operations to a memory controller or a host.

The host 120 may perform a test for the memory module 110. Each of the plurality of memory devices 112 in the memory module 110 may include data storage region for storing data. The host 120 may logically divide the data storage region in each of the plurality of memory devices 112 into two data storage regions. The host 120 may logically divide the data storage region into a lower data storage region LR and an upper data storage region UR. The lower data storage region LR may have substantially the same storage capacity as the upper data storage region UR. The storage capacity of the respective lower data storage region LR and upper data storage region UR may be a half of the storage capacity of a single data storage region in each of the plurality of memory devices 112. The host 120 may access only one of the lower data storage region LR and the upper data storage region UR, and the memory module 110 may include configurations for testing both of the lower data storage region LR and the upper data storage region UR according to the access of the host 120 to the memory module 110. Therefore, a time for testing the memory module 110 may be reduced to a time for testing the memory module 110.

Figure 2:
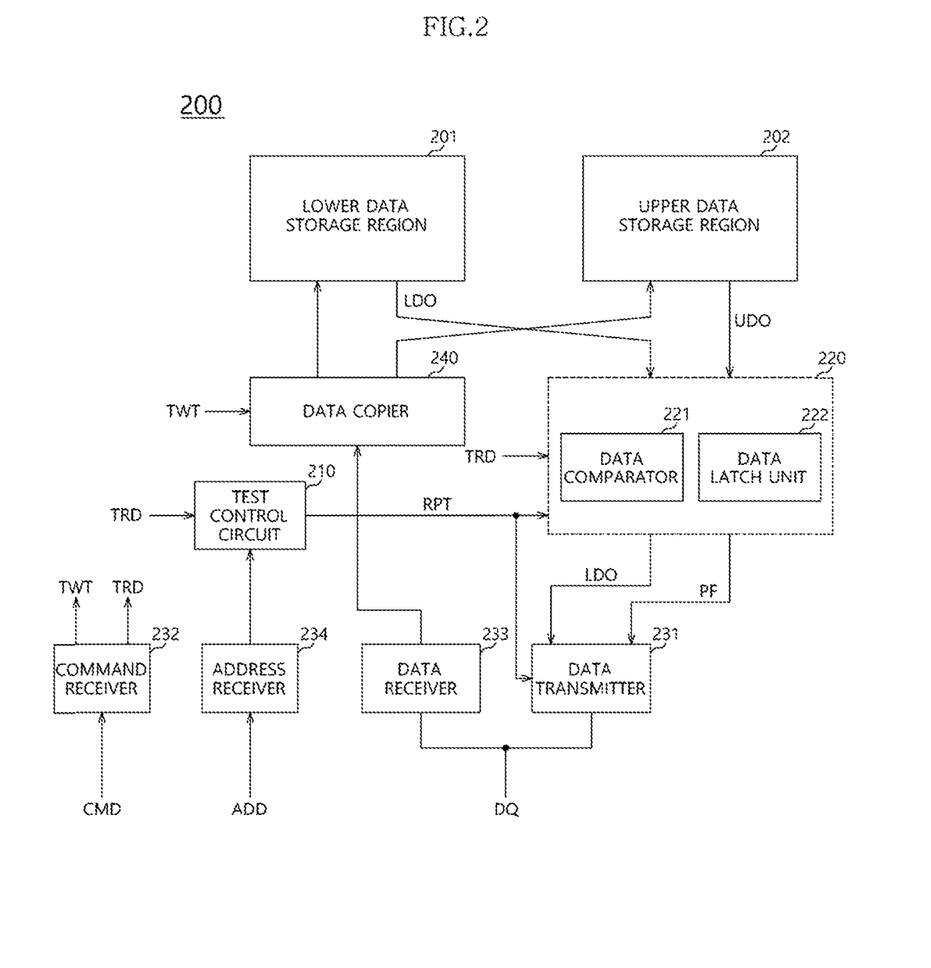
FIG. 2 is a diagram illustrating a representation of an example of a memory device in accordance with an embodiment.

FIG. 2 is a diagram illustrating a representation of an example of a memory device 200 in accordance with an embodiment. The memory device 200 may be each of the plurality of memory devices 112 described with reference to FIG. 1. Referring to FIG. 2, the memory device 200 may include the lower data storage region 201 and the upper data storage region 202. The lower data storage region 201 and the upper data storage region 202 may be logically divided from a single data storage region. For example, the lower data storage region 201 and the upper data storage region 202 may be identified by the address signal ADD. For example, the address signal ADD provided from the host 120 to the memory module 110 may include "n" bits. The most significant bit of the address signal ADD may be used as information differentiating between the lower data storage region 201 and the upper data storage region 202. For example, the remaining bits may be used for selecting a memory cell of the lower data storage region 201 when the most significant bit of the address signal ADD has a value of "0", and the remaining bits may be used for selecting a memory cell of the upper data storage region 202 when the most significant bit of the address signal ADD has a value of "1". When it doesn't matter what the most significant bit of the address signal ADD is or when the most significant bit of the address signal ADD is "don't care", the remaining bits of the address signal ADD may be used for simultaneously selecting memory cells of both of the lower data storage region 201 and the upper data storage region 202. Hereinafter, a test address signal may be the address signal ADD when the most significant bit doesn't matter or doesn't differentiate between the lower data storage region 201 and the upper data storage region 202.

The memory device 200 may include a test control circuit 210, a test data output circuit 220 and a data transmitter 231. The test control circuit 210 may generate a test control signal RPT based on a test read signal TRD and a test address signal. The test control circuit 210 may receive the address signal ADD and may decide whether the address signal ADD is the test address signal or a normal address signal. For example, the test control circuit 210 may determine the address signal ADD, the most significant bit of which is ignored, as the test address signal, and may determine the address signal ADD other than the test address signal as the normal address signal. The test control circuit 210 may store the received test address signal when the test read signal TRD is provided. After that, the test control circuit 210 may compare the stored test address signal with the address signal ADD provided from the host 120. When the address signal ADD provided from the host 120 is determined as the test address signal, the test control circuit 210 may enable the test control signal RPT. That is, the test control circuit 210 may enable the test control signal RPT when the test address signal is provided again.

The test data output circuit 220 may be electrically coupled to the lower data storage region 201 and the upper data storage region 202. The test data output circuit 220 may receive lower data LDO provided from the lower data storage region 201 and upper data UDO provided from the upper data storage region 202. The test data output circuit 220 may generate a decision signal PF by comparing the lower data LDO with the upper data UDO. The decision signal PF may include information representing an occurrence of a fail in the lower data storage region 201 and the upper data storage region 202. For example, it is assumed that the lower data storage region 201 and the upper data storage region 202 store the same data. When the lower data LDO is the same as the upper data UDO, the test data output circuit 220 may generate the decision signal PF of a low level. When the lower data LDO is different from the upper data UDO, the test data output circuit 220 may generate the decision signal PF of a high level. Therefore, when the decision signal PF has a low level, it is determined that a fail is not occurred in the lower data storage region 201 or the upper data storage region 202. Also, when the decision signal PF has a high level, it is determined that a fail is occurred in one of the lower data storage region 201 or the upper data storage region 202. The test data output circuit 220 may output the decision signal PF and one of the lower data LDO and the upper data UDO. For example, the test data output circuit 220 may output the decision signal PF and the lower data LDO. The test data output circuit 220 may receive the test read signal TRD and the test control signal RPT. The test data output circuit 220 may compare the lower data LDO with the upper data UDO in response to the test read signal TRD. Also, the test data output circuit 220 may store the lower data LDO in response to the test read signal TRD. The test data output circuit 220 may output the lower data LDO and the decision signal PF in response to the test control signal RPT. For example, the test data output circuit 220 may output the lower data LDO and the decision signal PF when the test control signal RPT is disabled. For example, the test data output circuit 220 may output the stored lower data LDO when the test control signal RPT is enabled. Further, the levels of the signals may be different from or the opposite of those described. For example, a signal described as having a "high" level may alternatively have a "low" level, and a signal described as having a "low" level may alternatively have a "high" level.

The test data output circuit 220 may include a data comparator 221 and a data latch unit 222. The data comparator 221 may receive the test read signal TRD, the lower data LDO and the upper data UDO. The data comparator 221 may generate the decision signal PF by comparing the lower data LDO with the upper data UDO in response to the test read signal TRD. The data latch unit 222 may receive the test read signal TRD and the lower data LDO. The data latch unit 222 may provide the lower data LDO to the data transmitter 231. The data latch unit 222 may store the lower data LDO in response to the test read signal TRD. The data latch unit 222 may output the stored lower data LDO in response to the test control signal RPT.

The data transmitter 231 may be electrically coupled to the test data output circuit 220, and may receive the lower data LDO and the decision signal PF provided from the test data output circuit 220. The data transmitter 231 may receive the test control signal RPT. The data transmitter 231 may output data DQ by inverting or noninverting the lower data LDO according to the decision signal PF. For example, the data transmitter 231 may generate the data DQ by inverting the lower data LDO when the decision signal PF represents the occurrence of a fail, and may generate data DQ without inversion of the lower data LDO when the decision signal PF represents a non-occurrence of a fail. The data transmitter 231 may invert the lower data LDO when the decision signal PF has a high level, and may not invert the lower data LDO when the decision signal PF has a low level. The data transmitter 231 may output the lower data LDO, which is output from the test data output circuit 220, as the data DQ according to the test control signal RPT. The data transmitter 231 may be electrically coupled to the data latch unit 222, and may receive the lower data LDO and the decision signal PF. The data transmitter 231 may output the data DQ to the host 120. In an embodiment, for example, the data transmitter 231 may be output the lower data LDO by inverting one or more particular bits of the lower data LDO.

Referring to FIG. 2, the memory device 200 may further include a command receiver 232, a data receiver 233, an address receiver 234, and a data copier 240. The command receiver 232 may receive the command signal CMD provided from the host 120. The command receiver 232 may generate the test read signal TRD and a test write signal TWT in response to the command signal CMD. The data receiver 233 may receive the data DQ provided from the host 120. The address receiver 234 may receive the address signal ADD provided from the host 120. The address receiver 234 may provide the received address signal ADD to the test control circuit 210.

The data copier 240 may receive the data DQ through the data receiver 233. The data copier 240 may be electrically coupled to the lower data storage region 201 and the upper data storage region 202. The data copier 240 may provide the data DQ to both of the lower data storage region 201 and the upper data storage region 202 by copying the data DQ in response to the test write signal TWT. The data copier 240 may store the data DQ into both of the lower data storage region 201 and the upper data storage region 202 by providing the data DQ to both of the lower data storage region 201 and the upper data storage region 202 when the test write signal TWT is enabled.

Figure 3A:
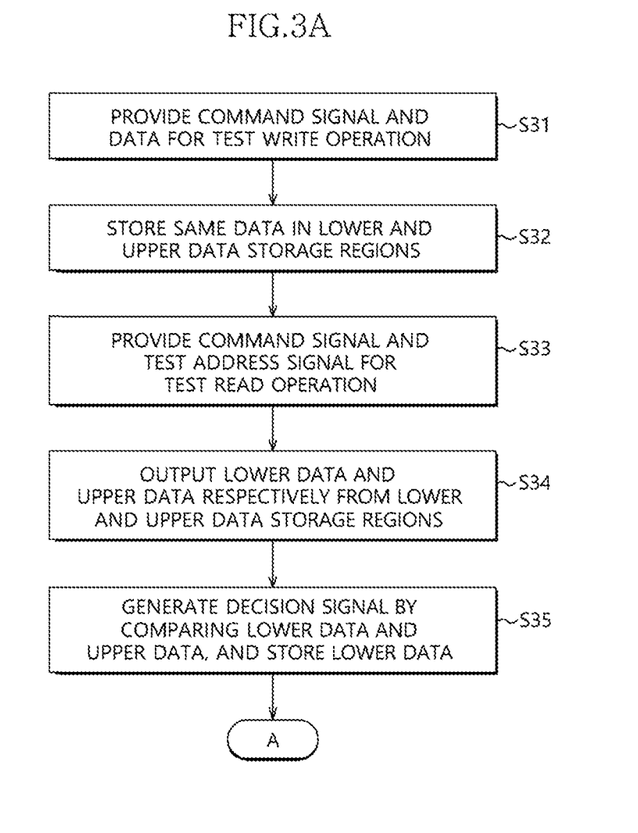
FIGS. 3A and 3B are a flowchart illustrating a representation of an example of an operation of a memory device and a system in accordance with an embodiment.
Figure 3B:
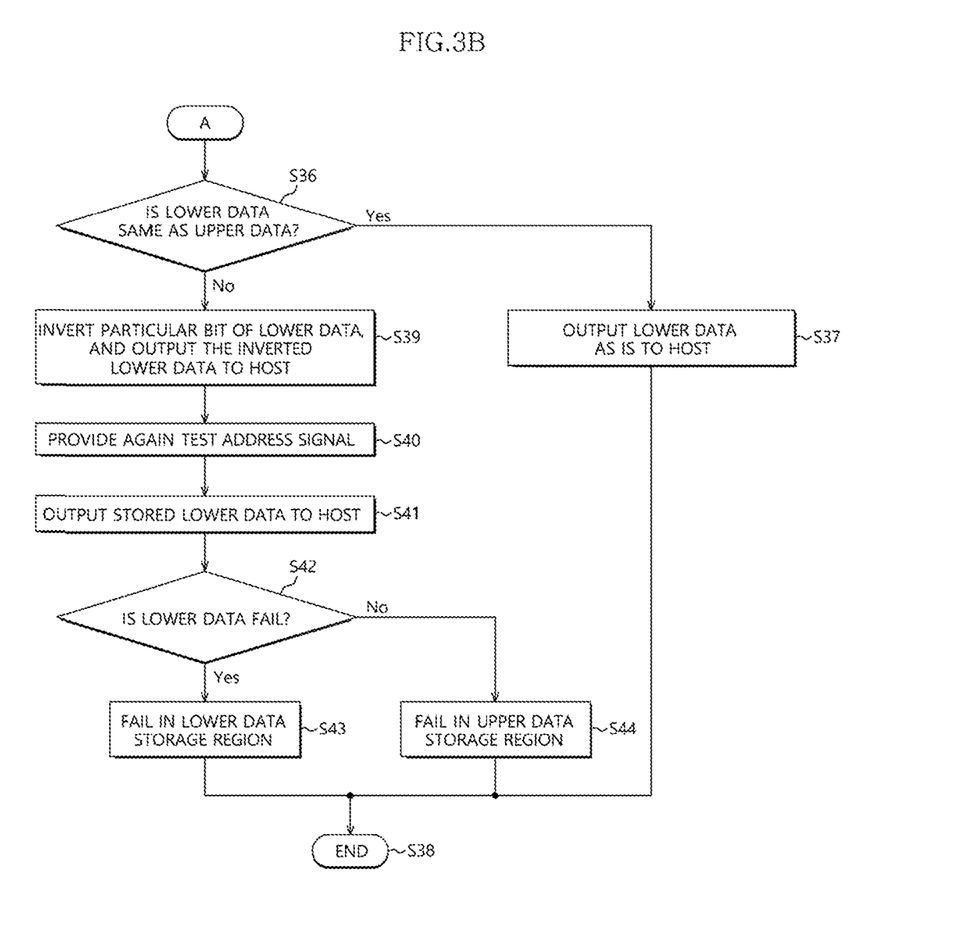

FIGS. 3A and 3B are a flowchart illustrating a representation of an example of an operation of the memory device 200 and the system 1 in accordance with an example of an embodiment of the present disclosure. In order to test the memory device 200, the host 120 may provide the memory device 200 with the command signal CMD and the data DQ for the test write operation at step S31. The command receiver 232 may generate the test write signal TWT in response to the command signal CMD. The data copier 240 may receive the data DQ provided through the data receiver 233, and may provide the data DQ to both of the lower data storage region 201 and the upper data storage region 202 in response to the test write signal TWT. Therefore, the same data may be stored into both of the lower data storage region 201 and the upper data storage region 202 at step S32. After that, the host 120 may provide the memory device 200 with the command signal CMD and the address signal ADD for the test read operation at step S33. The address signal ADD for the test read operation may be the test address signal. The command receiver 232 may generate the test read signal TRD in response to the command signal CMD. The test control circuit 210 may receive and store the test address signal. During the test read operation, the lower data storage region 201 may output the lower data LDO and the upper data storage region 202 may output the upper data UDO at step S34. The data comparator 221 may generate the decision signal PF by comparing the lower data LDO with the upper data UDO in response to the test read signal TRD. The data latch unit 222 may store the lower data LDO at step S35. The lower data LDO and the decision signal PF may be output to the data transmitter 231. The data transmitter 231 may output the lower data LDO by inverting or noninverting the lower data LDO according to the decision signal PF representing whether or not the lower data LDO is the same as the upper data UDO at step S36. When the decision signal PF has a low level, which means that the lower data LDO is the same as the upper data UDO, the data transmitter 231 may output the lower data LDO to the host without inversion of the lower data LDO at step S37. The host 120 may receive the lower data LDO, and may determine that no failure occurs in both of the lower data storage region 201 and the upper data storage region 202 according to the received lower data LDO. Accordingly, the test may end at step S38.

When the decision signal PF has a high level, which means that the lower data LDO is different from the upper data UDO, the data transmitter 231 may output the lower data LDO to the host by inverting the lower data LDO at step S39. Here, the data transmitter 231 may invert a particular bit of the lower data LDO and may output the inverted upper data UDO as the data DQ. Even though the host 120 may determine that a failure occurs in one of the lower data storage region 201 and the upper data storage region 202 according to the inverted lower data LDO, the host 120 may not exactly determine which one of the lower data storage region 201 and the upper data storage region 202 a failure occurred in.

In order to determine which one of the lower data storage region 201 and the upper data storage region 202 a failure occurred in, the host 120 may provide the memory device 200 with the test address signal as the address signal ADD at step S40. The test control circuit 210 may enable the test control signal RPT since the stored test address signal is the same as the received address signal ADD. In response to the test control signal RPT, the data latch unit 222 may output the stored lower data LDO to the data transmitter 231, and the data transmitter 231 may output the lower data LDO, which is provided from the data latch unit 222, as the data DQ to the host 120 at step S41. The host 120 may receive the lower data LDO provided as the data DQ from the memory device 200, and may determine whether the provided lower data LDO is a failed data at S42. For example, the host 120 may determine whether the provided lower data LDO is a failed data by comparing the provided lower data LDO and the data DQ provided during the test write operation. When the lower data LDO is a failed data, the host 120 may determine that a fail occurs in the lower data storage region 201 and a fail does not occur in the upper data storage region 202 at step S43. When the lower data LDO is not failed data, the host 120 may determine that a fail does not occur in the lower data storage region 201 and a fail occurs in the upper data storage region 202 at step S44. After determination that a fail occurs in one of the lower data storage region 201 and the upper data storage region 202, the test may end at S38.

Figure 4:
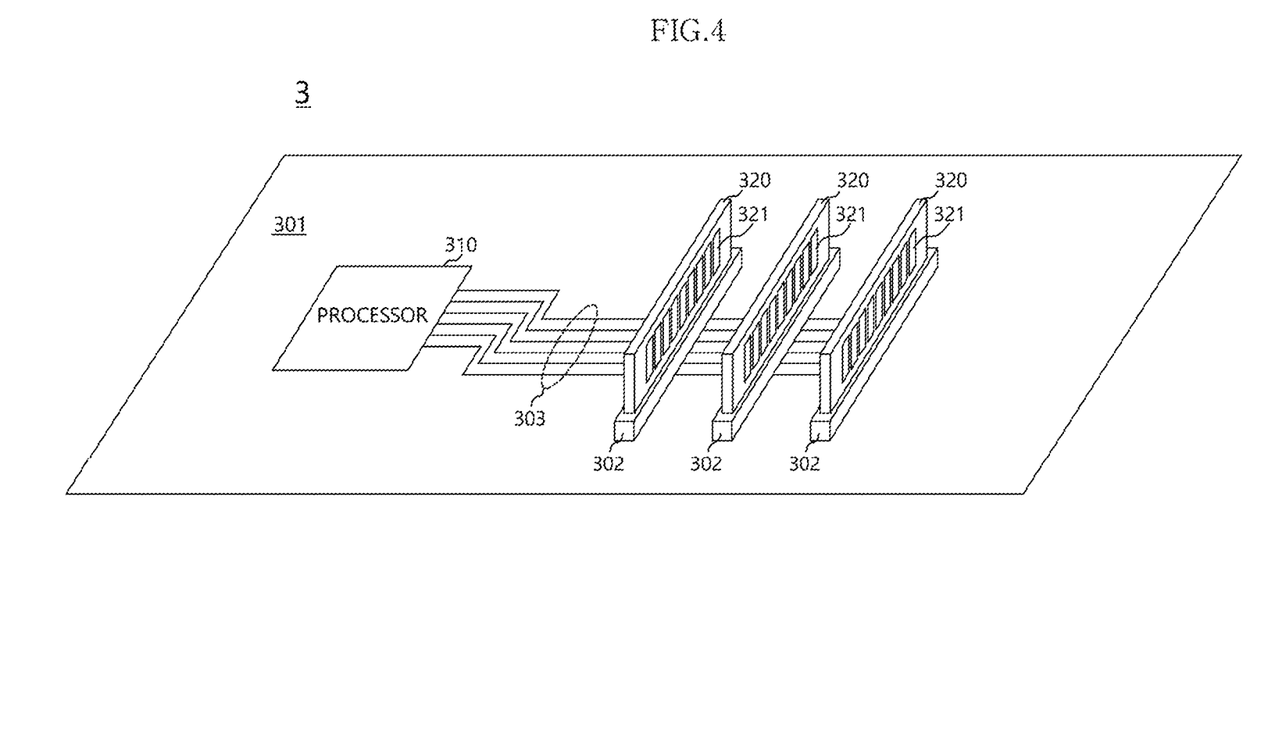
FIG. 4 is a diagram illustrating a representation of an example of a system in accordance with an embodiment.

FIG. 4 is a diagram illustrating a representation of an example of a system 3 in accordance with an embodiment. The system 3 may include a main board 301, a processor 310 and a memory module 320. The main board 301 may be a substrate, on which elements for the system 3 are mounted, and may be referred to as the Mother Board. The main board 301 may include a slot (not illustrated), on which the processor 310 is mounted, and a slot 302, on which the memory module 320 is mounted. The main board 301 may include wires 303 for electrically coupling the processor 310 and the memory module 320. The processor 310 may be mounted on the main board 301. The processor 310 may include one or more among the central processing unit (CPU), the graphic processing unit (GPU), the multi-media processor (MMP) and the digital signal processor. The processor 310 may be implemented in a form of the system on chip (SoC) by combining processor chips having various functions such as the application processor (AP).

The memory module 320 may be mounted on the main board 301 through the slot 302 of the main board 301. The memory module 320 may be coupled to the wires 303 of the main board 301 through the slot 302 and a module pin formed on a module substrate. For example, the memory module 320 may include Unbuffered Dual In-line Memory Module (UDIMM), Dual Inline Memory Module (DIMM), Registered Dual In-line Memory Module (RDIMM), Load Reduced Dual In-line Memory Module (LRDIMM), Small Outline Dual In-line Memory Module (SODIMM) and Non-Volatile Dual In-line Memory Module (NVDIMM) and so forth. The memory module 1 described with reference to FIG. 1 may be applied as the memory module 320. The memory module 320 may include a plurality of memory devices 321. In an embodiment, for example, the memory devices 112 may be applied as the memory devices 321. The plurality of memory devices 321 may include one or more of a volatile memory and a nonvolatile memory device. The volatile memories may include the Static RAM (SRAM), the Dynamic RAM (DRAM) and the Synchronous DRAM (SDRAM). The nonvolatile memories may include the Read Only Memory (ROM), the Programmable ROM (PROM), the Electrically Erase and Programmable ROM (EEPROM), the Electrically Programmable ROM (EPROM), the flash memory, the Phase change RAM (PRAM), the Magnetic RAM (MRAM), the Resistive RAM (RRAM), the Ferro-electric RAM (FRAM) and so forth. The plurality of memory devices 321 may include a stacked memory device, which is formed by stacking a plurality of chips, or a multi-chip package.

Figure 5:
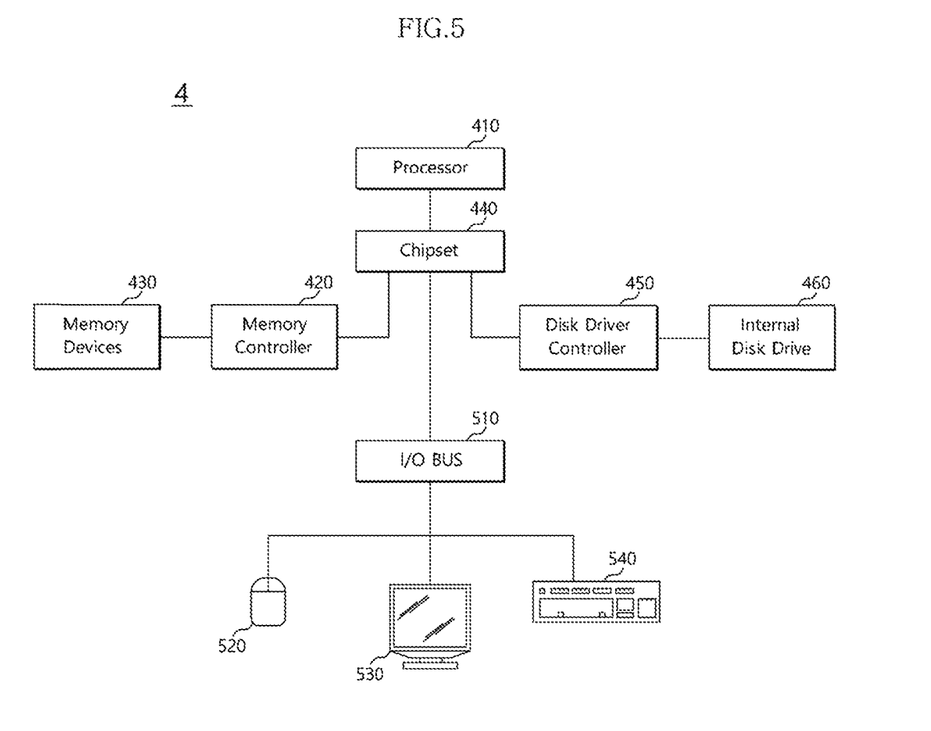
FIG. 5 is a diagram illustrating a representation of an example of a system in accordance with an embodiment.

FIG. 5 is a diagram illustrating a representation of an example of a system 4 in accordance with an embodiment. Referring to FIG. 5, the system 4 may include a processor 410, a memory controller 420 and memory devices 430. The processor 410 may be electrically coupled to the memory controller 420 through a chipset 440, and the memory controller 420 may be electrically coupled to the memory device 430 through a plurality of buses. Although FIG. 5 exemplifies a single processor 410, which will not limit the embodiments of the present disclosure, a plurality of processors may be physically or logically provided. The chipset 440 may provide a communication path transferring a signal between the processor 410 and the memory controller 420. The processor 410 may perform an arithmetic operation, and may provide a request and data to the memory controller 420 through the chipset 440 for input/output of intended data.

The memory controller 420 may transmit a command signal, an address signal, a clock signal and data through the plurality of buses. The memory device 430 may receive the signals provided from the memory controller 420, may store data and may output stored data to the memory controller 420. The memory devices 430 may include a plurality of memory modules, and may adopt the memory module 1 described with reference to FIG. 1.

Referring to FIG. 5, the system 4 may further include an input/output bus 510, input/output devices 520, 530 and 540, a disk driver controller 450 and an internal disk drive 460. The chipset 440 may be electrically coupled to the input/output bus 510. The input/output bus 510 may provide communication paths for transferring signals between the chipset 440 and the input/output devices 520, 530 and 540. The input/output devices 520, 530 and 540 may include, for example but not limited to, a mouse 520, a video player 530 or a keyboard 540. The input/output bus 510 may include any communication protocol capable of communicating with the input/output devices 520, 530 and 540. Further, the input/output bus 510 may be integrated inside the chipset 440.

The disk driver controller 450 may perform operations in connection to the chipset 440. The disk driver controller 450 may provide communication paths between the chipset 440 and one or more of the internal disk drives 460. The internal disk drive 460 may serve as an external data storage device by storing a command and data. The disk driver controller 450 and the internal disk drive 460 may perform communication with each other or with the chipset 440 by using any communication protocol including the input/output bus 510.

While certain embodiments have been described above, it will be understood to those skilled in the art that the embodiments described are by way of example only. Accordingly, the memory apparatus capable of determining failed region and test method thereof, memory module and system using the same should not be limited based on the described embodiments. Rather, the memory apparatus capable of determining failed region and test method thereof, memory module and system using the same described herein should only be limited in light of the claims that follow when taken in conjunction with the above description and accompanying drawings.

What is claimed is:

1. A memory device comprising:
a test data output circuit configured to generate a decision signal by comparing lower data output from a lower data storage region with upper data output from an upper data storage region, and output the lower data and the decision signal based on a test control signal;
a data transmitter configured to output the lower data by inverting or noninverting the lower data according to the decision signal; and
a test control circuit configured to generate the test control signal according to a test read signal and an address signal.

2. The memory device of claim 1, wherein the test data output circuit generates the decision signal and stores the lower data based on the test read signal, and outputs the stored lower data based on the test control signal.

3. The memory device of claim 2, wherein the test data output circuit comprises:
a data comparator configured to generate the decision signal by comparing the lower data with the upper data based on the test read signal; and
a data latch unit configured to store the lower data based on the test read signal, and to output the stored lower data based on the test control signal.

4. The memory device of claim 1, wherein the data transmitter outputs the lower data by inverting the lower data when the decision signal includes fail information, and outputs the lower data without inversion of the lower data when the decision signal does not include fail information.

5. The memory device of claim 4, wherein the data transmitter outputs the lower data by inverting one or more particular bits of the lower data.

6. The memory device of claim 1,
wherein the test control circuit determines whether the address signal is a test address signal or a normal address signal, and
wherein the test control circuit is configured to generate the test control signal according to the test read signal and the test address signal.

7. The memory device of claim 6, wherein the test control circuit stores the test address signal, and enables the test control signal based on the test control circuit receiving the test address signal again.

8. The memory device of claim 1, further comprising a data copier configured to store data into both of the lower data storage region and the upper data storage region based on a test write signal.

9. The memory device of claim 7, further comprising a command receiver configured to generate the test write signal and the test read signal by receiving a command signal.

10. A system comprising:
a memory module including a plurality of memory devices; and
a host configured to control the memory module by communicating with the memory module,
wherein each of the plurality of memory devices includes:
a test data output circuit configured to generate a decision signal by comparing lower data output from a lower data storage region with upper data output from an upper data storage region, and output the lower data and the decision signal based on a test control signal;
a data transmitter configured to output the lower data by inverting or noninverting the lower data according to the decision signal; and
a test control circuit configured to generate the test control signal according to a test read signal and an address signal.

11. The system of claim 10, wherein the test data output circuit generates the decision signal and stores the lower data based on the test read signal, and outputs the stored lower data based on the test control signal.

12. The system of claim 11, wherein the test data output circuit includes:
a data comparator configured to generate the decision signal by comparing the lower data with the upper data based on the test read signal; and
a data latch unit configured to store the lower data based on the test read signal, and to output the stored lower data based on the test control signal.

13. The system of claim 10, wherein the data transmitter outputs data, which is generated by inverting the lower data, to the host when the decision signal includes fail information, and outputs data, which is generated without inversion of the lower data, to the host when the decision signal does not include fail information.

14. The system of claim 13, wherein the data transmitter generates the data by inverting one or more particular bits of the lower data.

15. The system of claim 10,
wherein the test control circuit determines whether the address signal is a test address signal or a normal address signal, and
wherein the test control circuit is configured to generate the test control signal according to the test read signal and the test address signal.

16. The system of claim 15, wherein the test control circuit stores the test address signal, and enables the test control signal based on the test control circuit receiving the test address signal from the host again.

17. The system of claim 10, wherein each of the plurality of memory devices further includes a data copier configured to store data into both of the lower data storage region and the upper data storage region based on a test write signal.

18. The system of claim 17, wherein each of the plurality of memory devices further includes a command receiver configured to generate the test write signal and the test read signal by receiving a command signal from the host.

19. A memory device comprising:
a test data output circuit configured to compare lower data output from a lower data storage region with upper data output from an upper data storage region and make a decision; and
a data transmitter configured to output the lower data by inverting or noninverting the lower data according to the decision.

* * * * *